United States Patent
Lee

(10) Patent No.: US 6,176,304 B1
(45) Date of Patent: Jan. 23, 2001

(54) HEAT SINK

(75) Inventor: Hsieh-Kun Lee, Chung-Ho (TW)

(73) Assignee: Hon Hai Precision Ind. Co., Ltd., Taipei Hsien (TW)

( * ) Notice: Under 35 U.S.C. 154(b), the term of this patent shall be extended for 0 days.

(21) Appl. No.: 09/330,279

(22) Filed: Jun. 11, 1999

(30) Foreign Application Priority Data

Nov. 24, 1998 (TW) ................................. 87219528

(51) Int. Cl.$^7$ ................................. F28F 7/00; H01L 23/34
(52) U.S. Cl. ........................ 165/185; 165/80.3; 257/722
(58) Field of Search ................. 165/185, 80.3; 361/695; 257/722, 718, 719

(56) References Cited

U.S. PATENT DOCUMENTS

| | | | |
|---|---|---|---|
| 4,978,638 | * 12/1990 | Buller et al. | 29/825 |
| 5,038,858 | * 8/1991 | Mertol | 165/80.3 |
| 5,394,299 | * 2/1995 | Chu et al. | 361/705 |
| 5,533,257 | * 7/1996 | Romero et al. | 165/80.3 |
| 5,771,966 | * 6/1998 | Jacoby | 165/185 |
| 5,791,406 | * 8/1998 | Gonner et al. | 165/80.3 |
| 5,963,795 | * 10/1999 | Schneider et al. | 438/122 |
| 6,008,536 | * 8/1991 | Mertol | 361/704 |

FOREIGN PATENT DOCUMENTS

2502472 * 7/1976 (DE) ................................. 165/185

* cited by examiner

*Primary Examiner*—Ira S. Lazarus
*Assistant Examiner*—Tho Duong
(74) *Attorney, Agent, or Firm*—Wei Te Chung

(57) ABSTRACT

A heat sink includes a base having a plurality of ribs formed thereon and defining a plurality of grooves therebetween, and a folded fin member having a plurality of side walls connected by alternately arranged top and bottom walls. The folded fin member is mounted to the base by inserting the bottom walls thereof into the grooves of the base to directly contact a top surface of the base. Thermal grease, wax, or tape is interposed between the bottom walls of the folded fin member and the top surface of the base for enhancing heat transfer therebetween. Each rib of the base has two corrugated inside faces and each side wall of the folded fin member has at least one inclined tab extending therefrom for engaging with the corresponding corrugated inside face of the ribs of the base thereby securing the folded fin member to the base.

5 Claims, 4 Drawing Sheets

HEAT SINK

BACKGROUND OF THE INVENTION

1. Field of the Invention

The present invention generally relates to a heat sink for removing heat from an electronic device, such as a central processing unit of a computer, and in particular, to a composite heat sink comprising an aluminum-extruded base on which a folded fin made by repeatedly folding a thin conductive plate is fixed.

2. The Prior Art

Heat sinks are used to remove heat from an electronic device, such as a central processing unit. There are two general types of heat sinks available on the market, respectively shown in FIGS. 3A, 3B and FIG. 4.

In FIGS. 3A and 3B, an aluminum-extruded heat sink is shown. A heat sink 100 is made by first performing an aluminum extruding process on a structure having a base 102 to form a plurality of fins 104 extending therefrom and defining air passages 106 having a depth of h1 therebetween as shown in FIG. 3A. The heat sink 100 is further machined by sawing the air passages 106 to a depth h2, as shown in FIG. 3B, which is greater than the original depth h1 for increasing the total surface area of the heat sink 100. The sawing operation is time- and labor-consuming. Furthermore, waste is generated during the sawing operation which, unless properly removed and cleaned, obstructs air flow through the passages 106 thereby reducing the heat removal rate of the heat sink 100.

In FIG. 4, a folded fin heat sink 200 is shown. The folded fin 200 is made by repeatedly folding a thin conductive plate to form a number of side walls 202 connected by alternately arranged top and bottom walls 205, 204. A plurality of air passageways 206 are defined between adjacent side walls 202 for air to flow therethrough. The bottom walls 204 are positioned on and attached to a top face 208 of an electronic device 210 from which heat is to be removed. The attachment of the folded fin 200 to the electronic device 210 is usually done by means of an adhesive. Gaps or air voids are usually present between the bottom walls 204 and the electronic device 210 thereby reducing the heat removal rate. Furthermore, the attachment of the folded fin 200 to the electronic device 210 by means of adhesive is unreliable and the folded fin 200 may become easily detached from the electronic device 210.

It is thus desirable to have a heat sink, which does not exhibit the disadvantages associated with conventional heat sinks.

SUMMARY OF THE INVENTION

Accordingly, an object of the present invention is to provide a heat sink which has a composite structure comprising a folded fin member mounted to an aluminum-extruded base for simplifying the manufacturing process of the heat sink while enhancing the performance thereof.

To achieve the above objects, a heat sink in accordance with the present invention comprises a base having a plurality of ribs formed thereon and defining a plurality of grooves therebetween, and a folded fin member having a plurality of side walls connected by alternately arranged top and bottom walls. The folded fin member is mounted to the base by inserting the bottom walls thereof into the grooves of the base to directly contact a top surface of the base. Thermal grease, wax, or tape is interposed between the bottom walls of the folded fin member and the top surface of the base for enhancing heat transfer therebetween. Each rib of the base has two corrugated inside faces and each side wall of the folded fin member has at least one inclined tab extending therefrom for engaging with the corresponding corrugated inside face of the ribs of the base thereby securing the folded fin member to the base.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
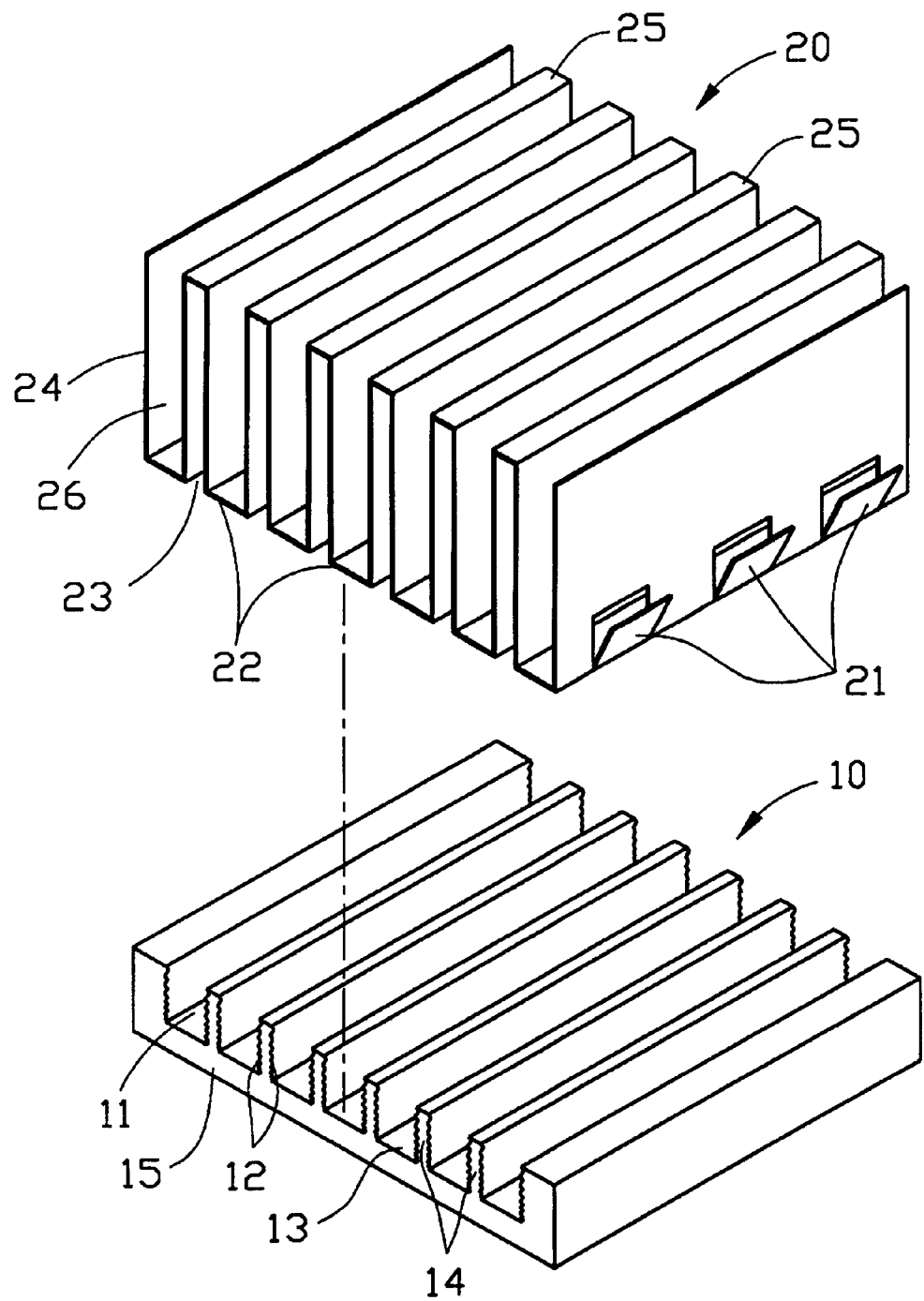
FIG. 1 is an exploded view of a heat sink in accordance with the present invention.
Figure 2:
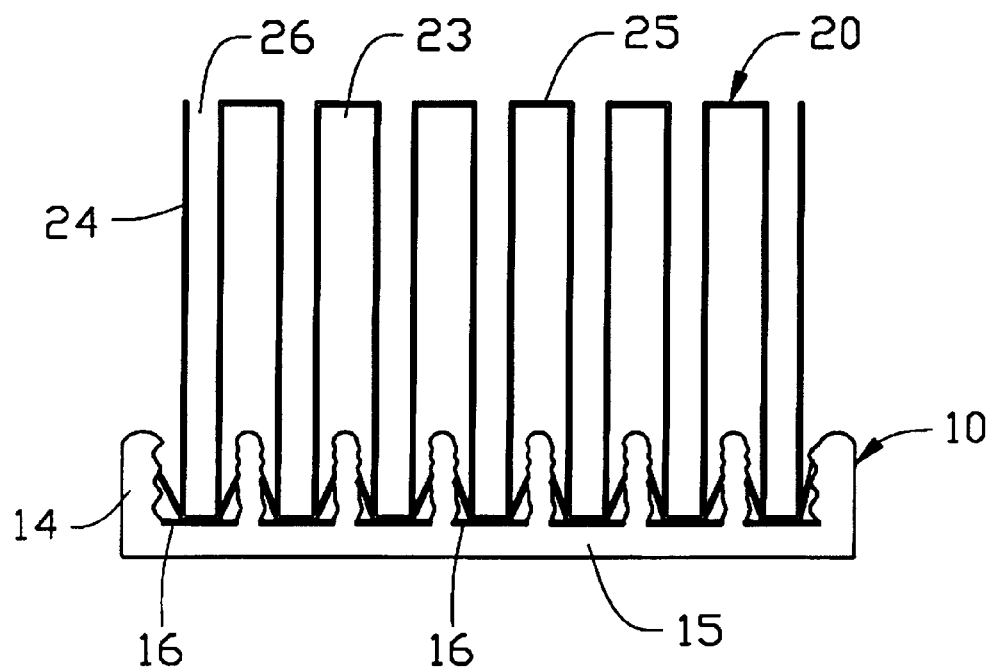
FIG. 2 is a side-elevational view of the heat sink of the present invention.
Figure 3A:
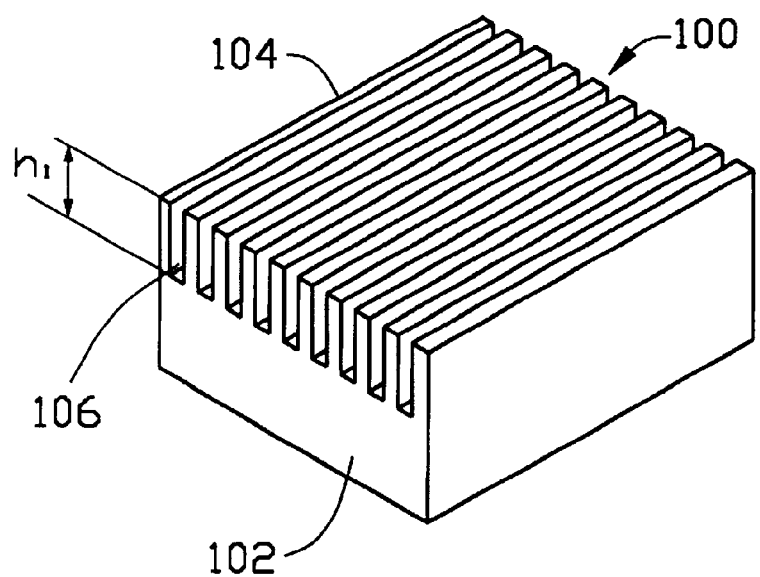
FIG. 3A is a perspective view of a first prior art heat sink before air passageways are sawed.
Figure 3B:
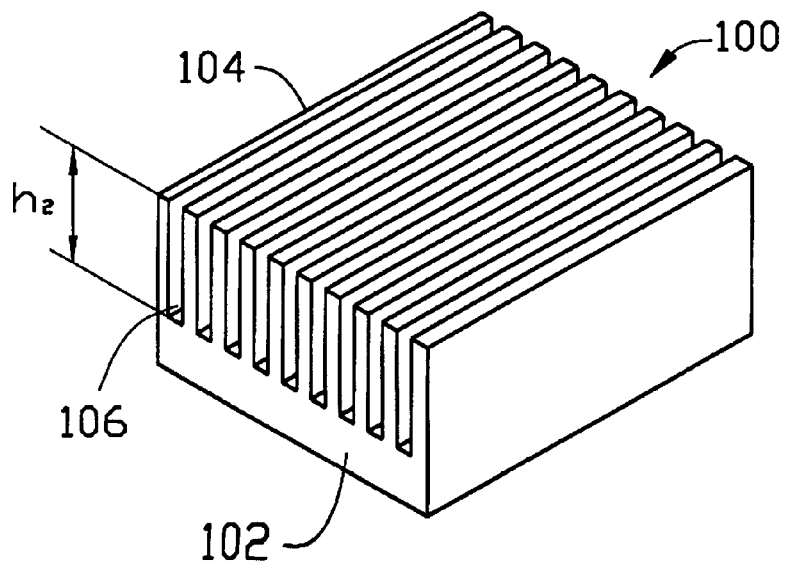
FIG. 3B is similar to FIG. 3A after the air passageways are sawed.
Figure 4:
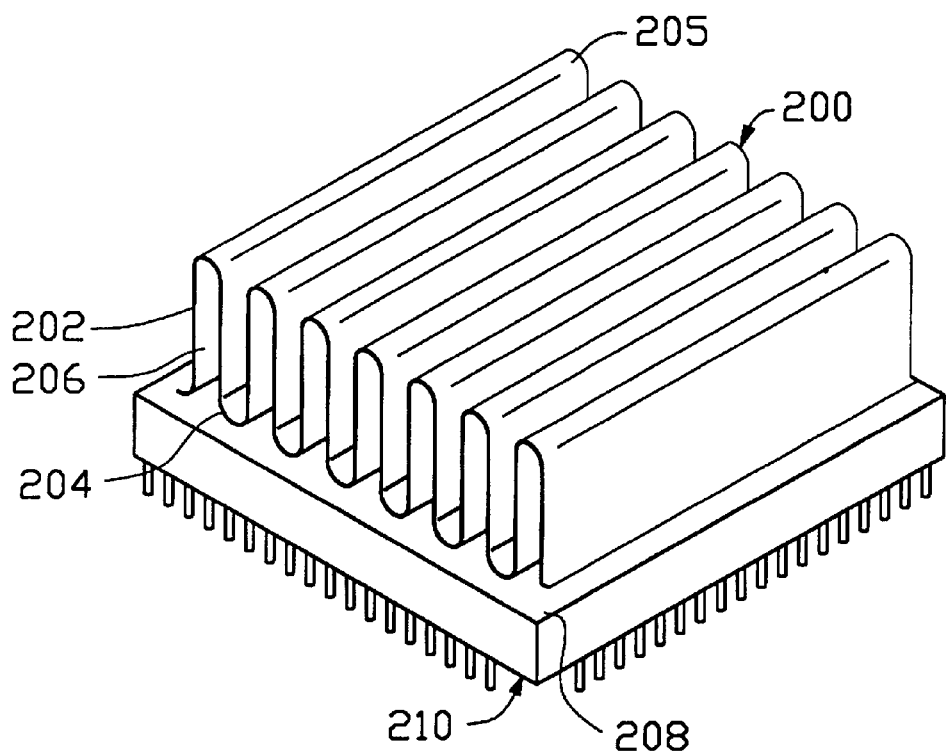
FIG. 4 is a perspective view of a second prior art heat sink mounted to an electronic device.

Referring to the drawings and in particular to FIGS. 1 and 2, a heat sink constructed in accordance with the present invention comprises a base 10 formed by aluminum extrusion, having a flat body 15 and a plurality of spaced ribs 14 formed on a top surface 13 thereof. The ribs 14 define grooves 11 therebetween. Each rib 14 has two opposite corrugated inside faces 12.

A folded fin member 20 made of a thin conductive plate by means of folding forms a plurality of parallel side walls 24 which are connected to each other by means of alternately arranged top and bottom walls 25, 22 whereby a channel 23 is defined between adjacent bottom walls 22 and an air passageway 26 is defined between adjacent top walls 25.

As shown in FIG. 2, the folded fin 20 is mounted to the base 10 by fitting the channels 23 over the corresponding ribs 14 of the base 10 whereby the bottom walls 22 of the folded fin member 20 are received in the corresponding grooves 11 of the base 10 and positioned on and in direct contact with the top face 13 thereof for heat transfer therebetween. Preferably, a thermally conductive material 16 such as thermal grease, thermal wax or thermal tape is interposed between the top surface 13 of the base 10 and the bottom walls 22 of the folded fin member 20 for facilitating heat transfer therebetween.

Each side wall 24 of the folded fin member 20 is provided with at least one inclined tab 21 which extends into the corresponding channel 23 and engages with the corresponding corrugated inside face 12 of the rib 14 of the base 10 for securely retaining the folded fin member 20 on the base 10.

Preferably, each bottom wall 22 of the folded fin member 20 is formed by repeatedly folding the thin conductive plate for the formation of a substantially flat surface which provides a firm contact with the top surface 13 of the base 10.

Although the present invention has been described with reference to a preferred embodiment, it is apparent to those skilled in the art that a variety of modifications and changes may be made without departing from the scope of the present invention which is intended to be defined by the appended claims.

What is claimed is:

1. A heat sink comprising:

a base forming a plurality of spaced ribs on a top surface thereof, the ribs defining a plurality of grooves therebetween, each rib having two inside faces;

a folded fin member comprising a plurality of spaced side walls connected to each other by alternately arranged top and bottom walls, air passageways being defined between adjacent top walls, channels being defined between adjacent bottom walls and fit over the corresponding ribs of the base whereby the bottom walls of the folded fin member are received in the grooves of the base and positioned on and in contact with the top surface thereof; and retaining means arranged between the side walls of the folded fin member and the inside faces of the corresponding ribs of the base for retaining the folded fin member on the base;

wherein the retaining means comprises at least one inclined tab extending from each side wall of the folded fin member toward the corresponding inside face of the rib of the base, the inside face of the rib of the base being corrugated to facilitate engagement with the inclined tab thereby securing the folded fin member on the base.

2. The heat sink as claimed in claim 1, wherein a thermally conductive material is interposed between each bottom wall of the folded fin member and the top face of the base.

3. The heat sink as claimed in claim 2, wherein the thermally conductive material comprises thermal grease.

4. The heat sink as claimed in claim 2, wherein the thermally conductive material comprises thermal tape.

5. The heat sink as claimed in claim 2, wherein the thermally conductive material comprises thermal wax.

* * * * *